United States Patent
Cheng et al.

(10) Patent No.: US 10,896,949 B2
(45) Date of Patent: Jan. 19, 2021

(54) INDUCTOR/TRANSFORMER WITH CLOSED RING

(71) Applicant: QUALCOMM Incorporated, San Diego, CA (US)

(72) Inventors: Haitao Cheng, San Diego, CA (US); Chao Song, San Diego, CA (US); Ye Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 15 days.

(21) Appl. No.: 16/106,160

(22) Filed: Aug. 21, 2018

(65) Prior Publication Data
US 2020/0066829 A1 Feb. 27, 2020

(51) Int. Cl.
*H01L 49/02* (2006.01)
*H01F 17/00* (2006.01)
*H01L 23/522* (2006.01)
*H01L 27/08* (2006.01)

(52) U.S. Cl.
CPC ......... *H01L 28/10* (2013.01); *H01F 17/0006* (2013.01); *H01L 23/5227* (2013.01); *H01L 27/08* (2013.01); *H01F 2017/0046* (2013.01); *H03J 2200/35* (2013.01)

(58) Field of Classification Search
None
See application file for complete search history.

(56) References Cited

U.S. PATENT DOCUMENTS

2005/0068146 A1* 3/2005 Jessie .................. H01F 17/0006
336/200

* cited by examiner

*Primary Examiner* — Nicholas J Tobergte
*Assistant Examiner* — Kien C Ly
(74) *Attorney, Agent, or Firm* — Loza & Loza, LLP/Qualcomm (57) ABSTRACT

Aspects generally relate to adjusting, or lowering, the Q of an inductor. In one embodiment, an integrated circuit includes an inductor and a conductive closed ring inside a periphery of the inductor. In another embodiment, there can be a plurality of closed rings inside the periphery of the inductor. The conductive closed rings are magnetically coupled to the inductor to adjust the Q.

6 Claims, 7 Drawing Sheets

INDUCTOR/TRANSFORMER WITH CLOSED RING

BACKGROUND

I. Field of the Disclosure

Aspects of the disclosure relate generally to inductors and transformers, and in particular to adjusting the quality (Q) factor of the inductor or transformer.

II. Background

As wireless communication systems continue to evolve there is increasing need to improve performance of radio frequency (RF) devices. Some types of RF device applications there is a need to pass narrow bandwidth signals, while in other applications it may be desirable to pass wide bandwidth signals. For example, in the fifth generation (5G) standard being developed there may be a need to pass wide bandwidth signals for components such as amplifiers. To meet these requirements the components used in circuitry need to be able to pass wide bandwidth signals. However, some design requirements may be such that a desired bandwidth cannot be achieved for a component.

There is a need for mechanisms and methods to produce components that will pass the desired band width signal while still meeting other design requirements.

SUMMARY OF THE DISCLOSURE

The described aspects generally relate to adjust the quality (Q) factor of an inductor formed on a chip. In some applications, such as power amplified RF signal, there can be large bias currents passed through the inductor. Using large bias currents require the use of large (thick/wide) conductive traces to form the inductor to prevent electromigration (EM). Making the conductor used to form the inductor large (thick/wide) can minimize EM but it also lowers the resistance of the inductor leading to a higher quality (Q) factor of the inductor. In some applications it is desirable to have a inductor with a lower Q so that a wider bandwidth signal can be passed through the inductor.

Aspects describe how to adjust, or lower, the Q of an inductor. In one embodiment, an integrated circuit includes an inductor and a conductive closed ring inside a periphery of the inductor. In another embodiment, there can be a plurality of closed rings inside the periphery of the inductor. Some of the plurality of rings inside the periphery of the inductor can be coupled together. An additional aspect is that a conductive closed ring can be a single turn ring or a multi-turn ring. The inductor can be used in a radio frequency (RF) amplifier, such as a 5G RF amplifier. The inductor can also be used in a radio frequency (RF) filter, such as a 5G RF filter.

In another embodiment, an integrated circuit includes an inductor and a conductive configurable ring inside the periphery of the inductor, wherein the conductive configurable ring comprises a switch operable to configure the configurable ring as a closed ring or an open ring. In another embodiment, there can be a plurality of conductive configurable rings inside the periphery of the inductor. Some, or all, of the configurable rings can configured as closed rings or open rings. Also, there can be a combination of configurable rings and closed rings inside the periphery pf the inductor. The configurable rings can be single turn rings or multi-turn rings. The inductor can be used in an RF amplifier, such as a 5G RF amplifier. The inductor can also be used in a radio frequency (RF) filter, such as a 5G RF filter.

In another embodiment, a method of adjusting a quality (Q) factor of an inductor includes forming a loop inductor and forming a conductive ring in a periphery of the loop inductor, the conductive ring magnetically coupled to the inductor. The conductive ring can be a closed ring or a configurable ring. There can be a plurality of conductive rings inside the periphery of the inductor. The conductive rings can be closed rings or configurable rings or a combination of closed and configurable rings. The conductive ring(s) can be single turn or multi-turn rings. The inductor can be used in an RF amplifier, such as a 5G RF amplifier. The inductor can also be used in a radio frequency (RF) filter, such as a 5G RF filter.

Various aspect and features of the disclosure are described in further detail below.

BRIEF DESCRIPTION OF THE FIGURES

The accompanying drawings are presented to aid in the description and illustrations of embodiments and are not intended to be limitations thereof.

The drawings may not depict all components of a particular apparatus, structure, or method. Further, like reference numerals denote like features throughout the specification and figures.

DETAILED DESCRIPTION

Aspects disclosed in the following description and related drawings are directed to specific embodiments. Alternative embodiments may be devised without departing from the scope of the invention. Additionally, well-known elements may not be described in detail, or may be omitted, so as not to obscure relevant details. Embodiments disclosed may be suitably included in any electronic device.

Figure 1:
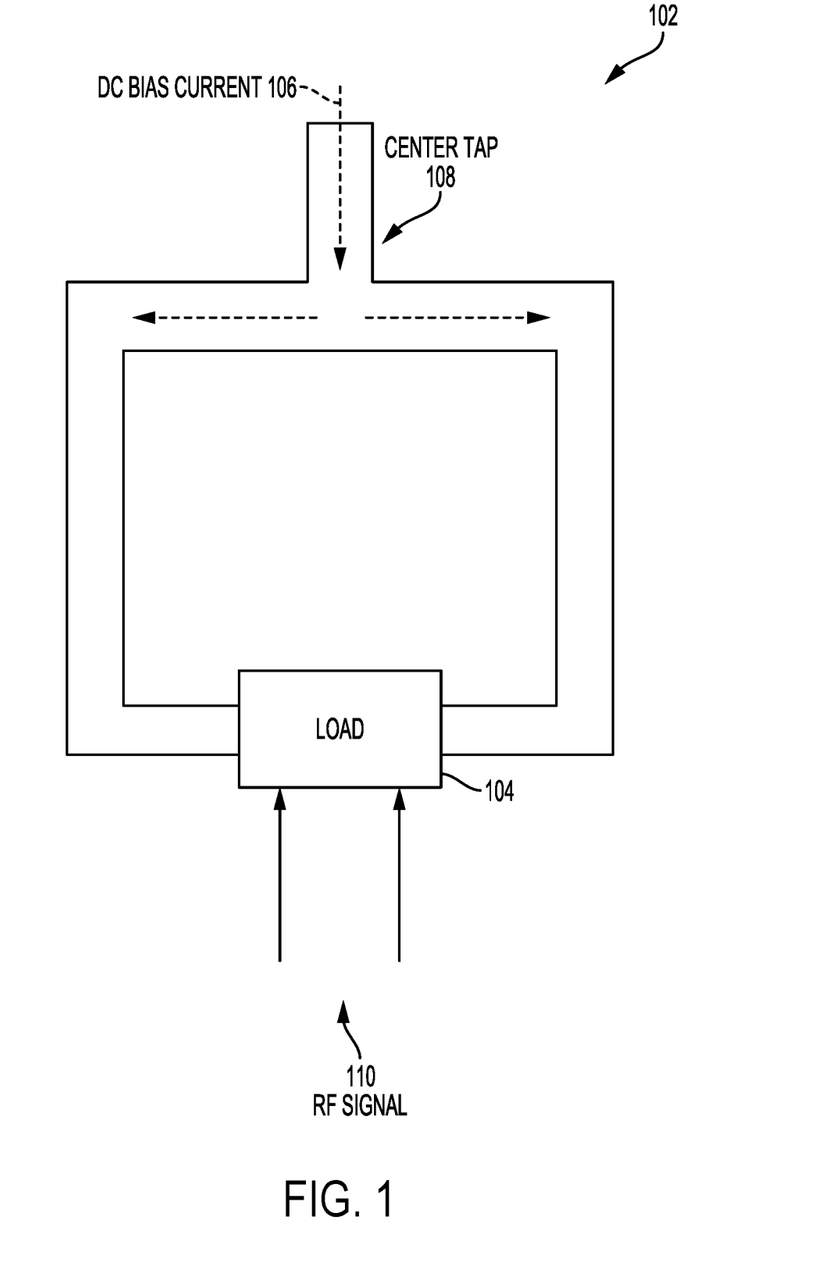
FIG. 1 is a drawing of an inductor.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting FIG. 1 is a drawing of an inductor 102. In the example of FIG. 1, the inductor 102 is a single loop, in other embodiments the inductor can have multiple loops. In addition, there can be at least two inductors that form a transformer.

In the example of FIG. 1, the loop of the inductor 102 is coupled to a load 104. The load can include other components, for example transistors, capacitors, resistors, and the like. In one embodiment, a DC bias current 106 is coupled to the inductor 102 through a center tap 108 of the inductor. The DC bias current 106 is a current to bias the components in the load 104. Coupled to the load 104 is a radio frequency (RF) signal 110. In one embodiment, the components in the load 104 and the inductor 102 are configured to filter the RF signal 110. For example, the RF signal 110 can be a 5G signal and the load 104 and inductor 102 are a 5G RF amplifier or filter.

In an embodiment, such as a power amplified for an RF signal, the DC bias current 106 can be large. A large DC bias current requires the conductor used to form the inductor 102 to be large (thick/wide) to prevent electromigration (EM).

EM is the transport of material caused by the gradual movement of ions in a conductor due to the momentum transfer between conducting electrons and diffusing metal atoms. EM can cause the eventual loss of connections or failure of an integrated circuit (IC), and therefore decreases the reliability of ICs.

Making the conductor used to form the inductor large (thick/wide) can minimize EM but it also lowers the resistance of the inductor 102 leading to a higher quality (Q) factor of the inductor. The Q of the inductor is the ratio of the inductance of the inductor to the resistance, as described in Equation 1.

$$Q = \frac{2\pi f L}{R} \quad (1)$$

Where f is the frequency, L is the inductance, and R is the resistance.

In general, the higher the Q of an inductor the narrower the bandwidth of an RF signal will pass through the inductor. In some applications it is desirable to pass a wider bandwidth signal, and thus have a lower Q inductor. One technique for lowering the Q of an inductor is to increase the resistance of the conductor used to form the inductor by making the conductor narrower or thinner. However, as noted, making the conductor narrower or thinner can lead to EM problems. Another technique for lowering the Q of the inductor is to add a resistor in the inductor. However, the addition of a resistor generates heat in a tiny area, degrading circuit performance and reliability.

Figure 2:
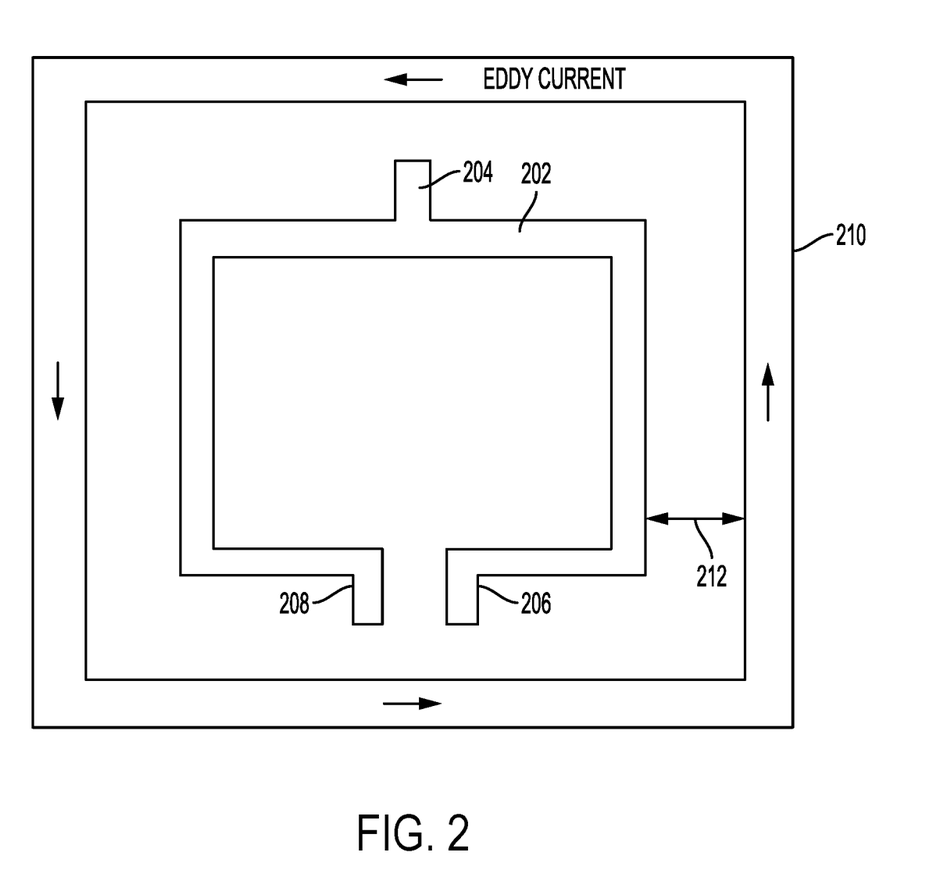
FIG. 2 is a diagram of an inductor with a conductive closed ring outside an inductor periphery.

FIG. 2 is a diagram of an inductor with a conductive closed ring outside an inductor periphery. As shown in FIG. 2, an inductor 202 is formed by a conductive material in a loop. The inductor 202 includes a center tap 204 that can be coupled to a DC bias current. The inductor 202 also includes two open ends 206 and 208 where other components, such as transistors, capacitors, inductors, resistors, and such, and signals, such as RF signals, can be coupled to the inductor 202. Surrounding an outer periphery of the inductor 202 is a closed ring 210 of conductive material.

In the example of FIG. 2, the Q of the inductor 202 is lowered through magnetic coupling between the inductor 202 and the conductive closed ring 210. The magnetic coupling induces eddy currents in the conductive closed ring 210 which lowers the effective inductance of the inductor 202 and increases the effective resistance of the inductor 202, and referring to Equation 1, lowering the inductance (L) and increasing the resistance (R) will lower the Q.

The amount the Q can be lowered using the configuration illustrated in FIG. 2 is limited. For example, due to additional components and circuitry coupled to the inductor, or layout constraints, there is a minimum standoff distance 212 between the inductor loop and the conductive closed ring. The larger the standoff distance 212 the less the magnetic coupling and less influence the conductive closed ring will have on the inductance level. In addition, in some cases it may be required to have a gap in the closed ring, so it is no longer closed, to accommodate circuit routing. If the closed loop has a gap there will not be any eddy current flow, so the Q of the inductor will not be influenced.

Figure 3:
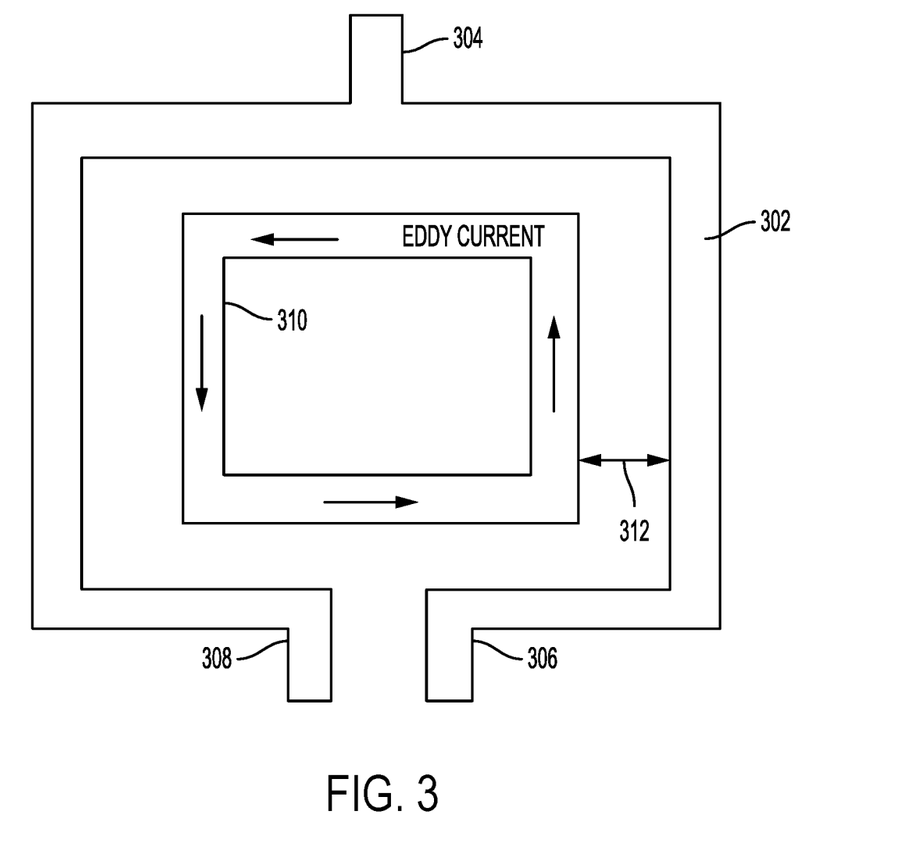
FIG. 3 is a diagram of an embodiment of an inductor with a conductive closed ring inside an inductor periphery.

FIG. 3 is a diagram of an embodiment of an inductor with a conductive closed ring inside an inductor periphery. As shown in FIG. 3, an inductor 302 is formed by a conductive material in a loop. The inductor 302 includes a center tap 304 that can be coupled to a DC bias current. The inductor 302 also includes two open ends 306 and 308 where other components, such as transistors, capacitors, inductors, and resistors can be coupled to the inductor 302. In addition, signals, such as RF signals, can be coupled to open ends 306 and 308, or to the components coupled to open ends 306 and 308. Inside a periphery of the inductor 302 is a conductive closed ring 310 of conductive material.

In the example of FIG. 3, the Q of the inductor 302 is lowered by magnetic coupling between the inductor 302 and the conductive closed ring 310. The magnetic coupling induces eddy currents in the conductive closed ring 310 which lowers the effective inductance and increases the effective resistance of the inductor 302, and referring to Equation 1, lowering the inductance (L) and increasing resistance (R) will lower the Q.

The amount the Q can be lowered using the configuration illustrated in FIG. 3 is increased over the configuration of FIG. 2. For example, additional components and circuitry coupled to the inductor, or layout constraints, do not affect a minimum standoff distance 312 between the inductor loop and the conductive closed ring because, typically, the area inside the loop of the inductor does not include any components or circuitry. The smaller the standoff distance 312 the more the magnetic coupling and more influence the closed ring will have on the inductance level. Simulations show that there can be a decrease in the Q factor from 10% to 50% using the configuration illustrated in FIG. 3. In addition, there could be an additional closed ring outside inductor periphery as shown in FIG. 2, combing the ring inside inductor periphery together to decrease the Q factor.

An additional benefit to the configuration illustrated in FIG. 3, is that unlike using a resistor to the lower the Q factor, which causes a hot spot around the resistor, the closed ring uniformly distributes any heat generated. Distributing the heat in a uniform manner improves heat dissipation of the device and improves reliability.

Figure 4A:
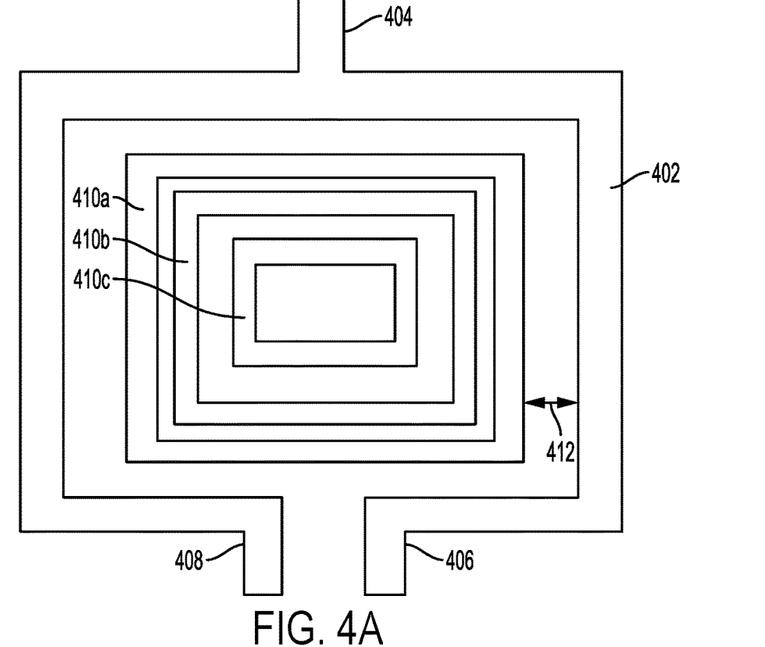
FIGS. 4A and 4B are diagrams of embodiments of inductors with multiple conductive closed rings inside an inductor periphery.
Figure 4B:
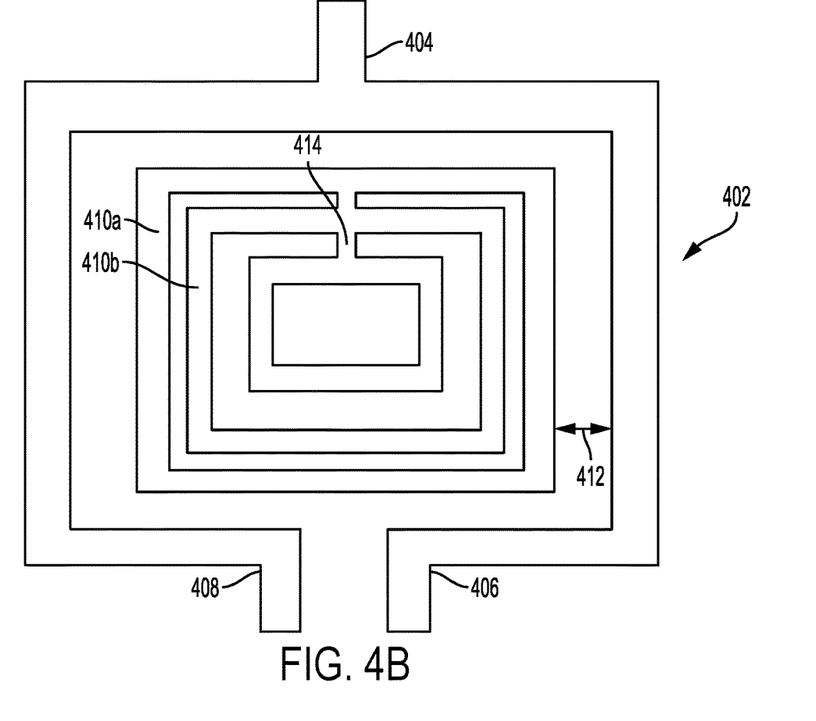

FIGS. 4A and 4B are diagrams of embodiments of inductors with multiple conductive closed rings inside an inductor periphery. FIG. 4A illustrates an inductor 402 formed by a conductive material in a loop. Similar to FIG. 3, the inductor 402 includes a center tap 404 that can be coupled to a DC bias current. The inductor 402 also includes two open ends 406 and 408 where other components, such as transistors, capacitors, inductors, and resistors can be coupled to the inductor 302. In addition, signals, such as RF signals can be coupled to open ends 406 and 408, or to the components coupled to open ends 406 and 408.

Inside a periphery of the inductor 402 is a plurality of conductive closed rings 410a, 410b, and 410c. The Q of the inductor 402 is lowered by magnetic coupling between the inductor 402 and the plurality of conductive closed rings 410a, 410b, and 410c. The magnetic coupling induces eddy currents in the plurality of conductive closed rings 410a, 410*b*, and 410*c* which lowers the effective inductance and increases effective resistance of the inductor 402, and referring to Equation 1, lowering the inductance (L) and increasing resistance (R) will lower the Q.

The amount the Q can be lowered using the configuration illustrated in FIG. 4 is increased over the configuration of FIG. 3 because of the additional eddy currents flowing in the plurality of conductive closed rings 410*a*, 410*b*, and 410*c*. Again, as in FIG. 3, there is not a constraint on a minimum standoff distance 412 between the inductor loop and a first closed ring 410*a* closest to the inductor 402. Again, heat is uniformly distributed by the plurality of closed rings.

FIG. 4B is similar to FIG. 4A, but in FIG. 4B a strap 414 couples the plurality of conductive closed rings 410*a*, 410*b*, and 410 together. The example of FIG. 4B shows the strap 414 coupling all of the plurality of conductive closed rings together, but in other embodiments, just a portion of the plurality of conductive closed rings are coupled together.

FIGS. 4A and 4B illustrate an example of three conductive closed rings 410*a*, 410*b*, and 410*c* located inside the inductor 402 periphery. In other embodiments, there can be any number of conductive closed rings within the periphery of the inductor 402, for example, two or more conductive closed rings. Also, the conductive closed rings in FIGS. 4A and 4B are shown as concentric, inside one and other, in other embodiments, the rings do not need to be concentric. Likewise, in another embodiment, there could be conductive closed rings that are side-by-side, instead of concentric, as well as any combination of concentric and side-by-side combinations.

Figure 5:
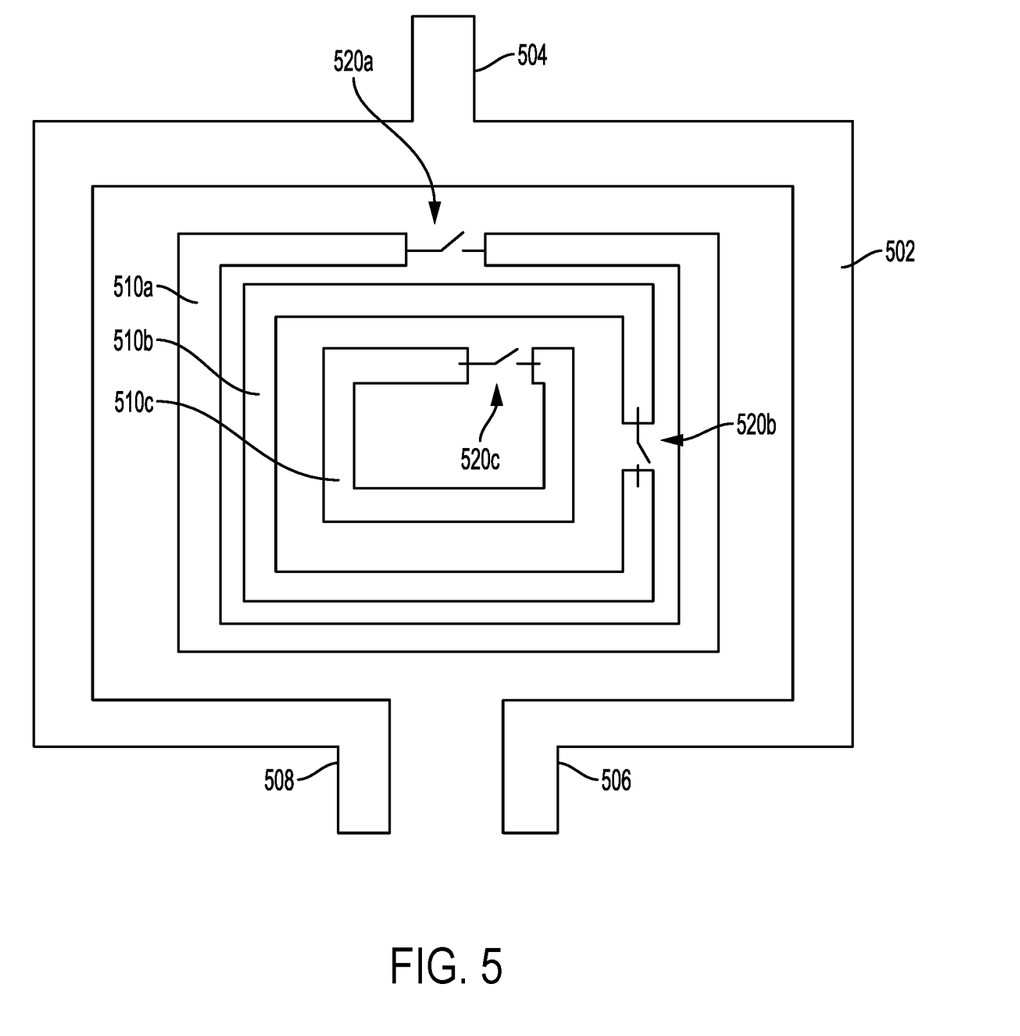
FIG. 5 is a diagram of another embodiment of an inductor with multiple conductive closed rings inside an inductor periphery.

FIG. 5 is a diagram of another embodiment of an inductor with multiple conductive closed rings inside an inductor periphery. Similar to FIG. 4A, the inductor 502 in FIG. 5 includes a center tap 504 that can be coupled to a DC bias current, and two open ends 506 and 508 where other components and signals, such as RF signals can be coupled.

A plurality of conductive configurable rings 510*a*, 510*b*, and 510*c*, inside the periphery of the inductor 502 are configured with switches 520*a*, 520*b*, and 520*c*. Operation of the switches 520*a*, 520*b*, and 520*c* can configure the conductive configurable rings 510*a*, 510*b*, and 510*c* to be conductive closed rings, able to conduct eddy currents, or open rings, unable to conduct eddy currents. For example, if a first switch 520*a* is closed a first conductive configurable ring 510*a* of the plurality of configurable rings forms a conductive closed ring able to conduct eddy current, while if first switch 520*a* is open the first conductive configurable ring 510*a* is not closed and is unable to conduct eddy current. Not being able to conduct eddy current means the first ring 510*a* will not affect the inductance of the inductor 502. Likewise, operation of the second and third switches 520*b* and 520*c* can make the second and third conductive configurable rings 510*b* and 510*c* be configured to conduct eddy current or not.

By operation of the switches 520*a*, 520*b*, and 520*c* various combinations of conductive closed rings can be configured. The ability to configure the number of conductive closed rings within the periphery of the inductor 502 provides flexibility in configuring the Q of the inductor 502.

The example of FIG. 5 illustrated three conductive configurable rings in the periphery of the inductor 502, in other embodiments, there can be any number of conductive configurable rings desired, for example, one or more conductive configurable rings. In another embodiment, some of the rings in the periphery of the inductor 502 can be conductive closed rings, with no switch, and others can be conductive configurable rings and include switches. Having various combinations of conductive closed rings and conductive configurable rings provide great flexibility in adjusting the Q factor of an inductor. In one embodiment, the switches 520*a*, 520*b*, and 520*c* can be transistors.

Figure 6A:
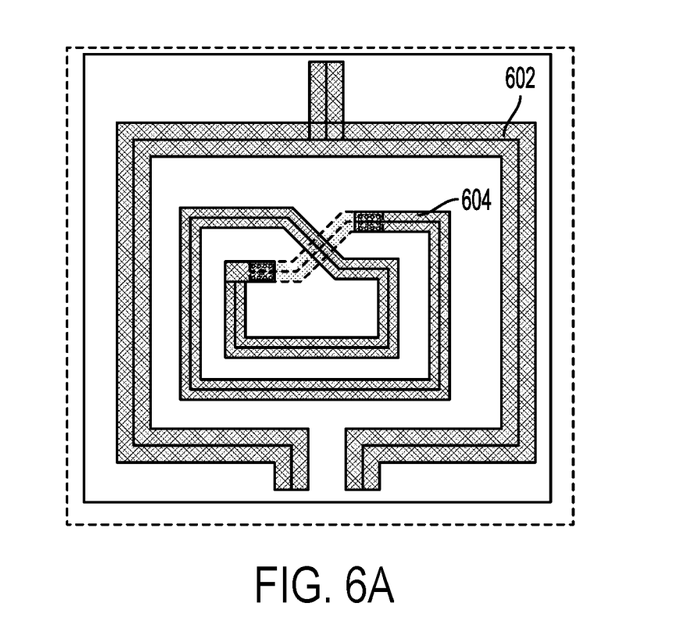
FIGS. 6A and 6B are diagrams of embodiments of inductors with conductive multi-turn closed rings inside an inductor periphery.
Figure 6B:
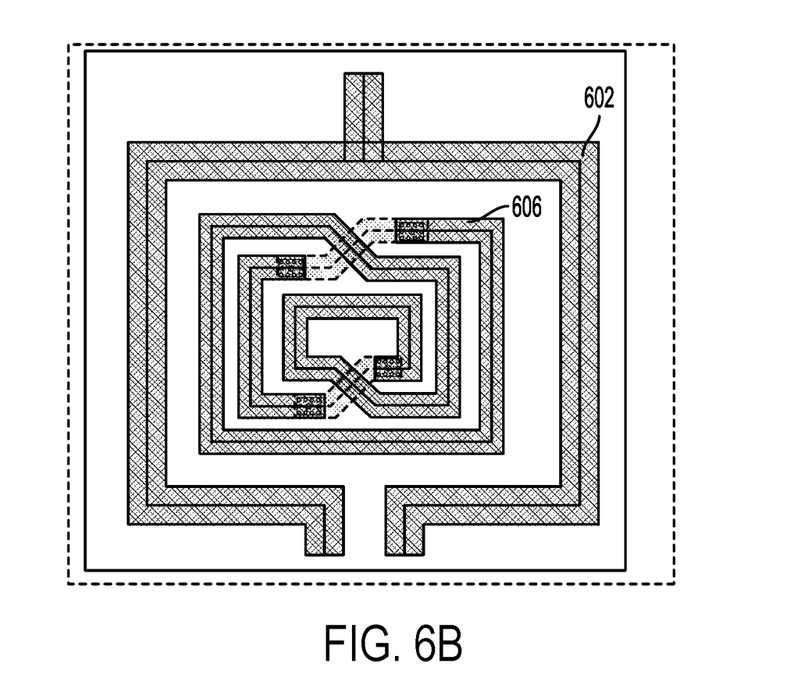

While aspects described above discuss single turn closed rings(s), multi-turn closed ring(s) can also be used. FIGS. 6A and 6B are diagrams of embodiments of inductors with conductive multi-turn closed rings inside an inductor periphery. As shown in FIG. 6A, there is an inductor 602, similar to the inductors described earlier. A conductive multi-turn closed ring 604 is within the periphery of the inductor 602. The conductive multi-turn closed ring 604 has two turns, or loops. In FIG. 6B, the conductive multi-turn closed ring 606 has three turns, or loops. While these examples illustrate two and three turn conductive multi-loop closed loops, any number of desired loops can be used. Also, the multi-turn rings can include switches to make them configurable to make all, or a portion, of the multi-turn ring non-conductive.

Figure 7:
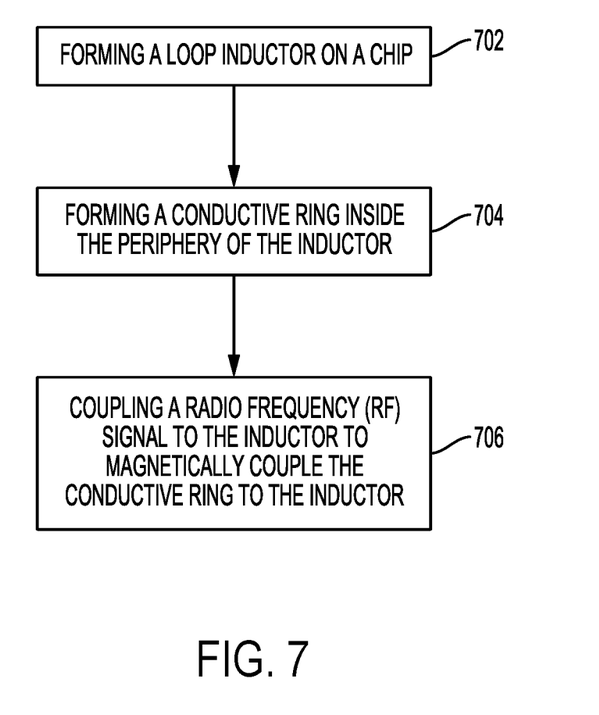
FIG. 7 is a flow diagram of adjusting a Q factor of an inductor.

FIG. 7 is a flow diagram of adjusting a Q factor of an inductor. Flow begins in block 802 where a loop inductor is formed on a chip. Flow continues to block 704 where a conductive ring is formed inside a periphery of the loop inductor. Flow continues to block 706 where a radio frequency is coupled to the inductor and the conductive ring is magnetically coupled to the inductor.

The conductive ring can be a closed ring, a configurable ring, or a multi-turn ring. Also, there can be a plurality of rings inside the periphery of the inductor. The plurality of rings can include combinations of closed rings, configurable rings, or multi-turn rings. At least some of the rings inside the periphery of the inductor can be coupled together. The inductor can be used in an RF amplifier circuit, such as a 5G RF amplifier. The inductor can also be used in a radio frequency (RF) filter, such as a 5G RF filter.

As described, to meet electro migration specifications, wide and thick metal is used for on-chip inductor or transformer design. However, the Q factor of the inductor may be too high to cover a wide frequency bandwidth. Therefore, conductive closed ring(s) are place inside the inductor/transformer periphery to reduce the Q factor, while still meeting electro migration specifications. This also improves the magnetic isolation from the inductor the nearby circuits. In the description, aspects were generally described applying generally to an inductor, however the aspects apply to transformers as well.

Aspects of the description include at least one conductive closed ring within the periphery of an inductor, for example, one conductive closed ring, two conductive closed rings, three conductive closed rings, etc. There can also be conductive configurable closed ring(s) that can be closed and open by operation of a switch. There can also be conductive multi-turn closed loops, and there can be conductive multi-turn closed rings with switches to remove portions of the multi-turn rings. Additional aspects include various combinations of conductive closed ring(s), conductive configurable closed ring(s), and conductive multi-turn closed ring(s). Also, the rings can be coupled to some, or all, of other rings in a combination of closed rings.

An aspect is that the ring(s) can be on same or different metal layers, compared with inductor metal layer. For example, the ring(s) can be under, or above, or on the same level as the inductor routing layer. In addition, ring(s) can be on one layer or stacked on multiple layers through vias. In the description above, the example ring(s) illustrated were generally rectangular. In other embodiments, the ring(s) can be other shapes, such orthogonal, round, oval, any polygons shape, or other shape. Also, there can be additional open or closed ring(s) outside the periphery of the inductor/transformer.

An additional aspect is that conductive multi-turn closed ring(s) can include switches so that portions of the conductive multi-turn closed loop can be effectively removed from the multi-turn closed ring. In other embodiments, conductive multi-turn closed ring(s) and be used with various combinations of conductive closed ring(s) and conductive configurable closed ring(s) to get a desired combination of closed ring(s) in the periphery of an inductor to adjust the Q of the inductor to a desired value.

The various illustrative logical blocks, modules, and circuits described in connection with the aspects disclosed herein may be implemented or performed in an integrated circuit (IC), a system on a chip (SoC), an Application Specific Integrated Circuit (ASIC), a Field Programmable Gate Array (FPGA) or other programmable logic device, discrete gate or transistor logic, discrete hardware components, or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit comprising:
    an inductor;
    a plurality of closed rings inside a periphery of the inductor; and
    a strap, comprising a conductive material, for electrically coupling at least some of the plurality of closed rings together.

2. The integrated circuit of claim 1, wherein the inductor is used in a radio frequency (RF) amplifier or filter.

3. The integrated circuit of claim 2, wherein the RF amplifier or filter is a 5G RF amplifier or filter.

4. An integrated circuit comprising:
    an inductor;
    a plurality of conductive configurable rings inside the periphery of the inductor; and
    a strap, comprising a conductive material, for electrically coupling at least some of the plurality of closed rings together, the plurality of conductive configurable rings comprising at least one a switch operable to configure at least a portion of the plurality of configurable rings to be nonconductive.

5. The integrated circuit of claim 4, wherein the inductor is used in a radio frequency (RF) amplifier or filter.

6. The integrated circuit of claim 5, wherein the RF amplifier or filter is a 5G RF amplifier or filter.

* * * * *